US012270163B1

(12) United States Patent
Bell et al.

(10) Patent No.: US 12,270,163 B1
(45) Date of Patent: Apr. 8, 2025

(54) LOW-PIM BARRIER STANCHION AND SAFETY BARRIER

(71) Applicant: ConcealFab, Inc., Colorado Springs, CO (US)

(72) Inventors: Thomas Bell, Larkspur, CO (US); Flynn McClellan, Colorado Springs, CO (US)

(73) Assignee: ConcealFab, Inc., Colorado Springs, CO (US)

( * ) Notice: Subject to any disclaimer, the term of this patent is extended or adjusted under 35 U.S.C. 154(b) by 0 days.

(21) Appl. No.: 18/904,178

(22) Filed: Oct. 2, 2024

Related U.S. Application Data

(63) Continuation of application No. 29/952,968, filed on Jul. 18, 2024, now Pat. No. Des. 1,060,503, and a continuation of application No. 29/952,910, filed on Jul. 18, 2024, now Pat. No. Des. 1,060,502.

(60) Provisional application No. 63/654,504, filed on May 31, 2024.

(51) Int. Cl.
*E01F 13/02* (2006.01)
*H05K 9/00* (2006.01)

(52) U.S. Cl.
CPC ........... *E01F 13/02* (2013.01); *H05K 9/0081* (2013.01)

(58) Field of Classification Search
CPC ............ E01F 13/02; E01F 9/012; E01F 9/016
See application file for complete search history.

(56) References Cited

U.S. PATENT DOCUMENTS

| 4,939,877 | A | 7/1990 | Claffey |
| 5,036,791 | A | 8/1991 | Thurston |
| 6,769,833 | B2 | 8/2004 | Dicke et al. |
| 7,025,016 | B1 | 4/2006 | Landes |

(Continued)

FOREIGN PATENT DOCUMENTS

| CH | 378737 A | 6/1964 |
| CN | 216379270 U | 4/2022 |

(Continued)

OTHER PUBLICATIONS

Yaobao, 11 Feet Plastic Barrier Chain, Warning Chain Red and White Plastic Warehouse Caution Safe Barrier Commercial Safety Barrier for Traffic, Events, Police, Queue Line, 3.3Mx10 Pcs,Dec. 30, 2020, amazon.

(Continued)

*Primary Examiner* — Daniel J Wiley
(74) *Attorney, Agent, or Firm* — Mehrman Law Office; Michael J. Mehrman

(57) ABSTRACT

A low-PIM barrier stanchion and a safety barrier including multiple low-PIM barrier stanchions and a low-PIM barrier line, such as plastic chain, extending between the barrier stanchions. The barrier stanchion includes a cap that functions as a barrier line receiver, a mast that functions as a sign receiver, and a base that functions as a ballast receiver. The cap includes a receptacle that receives a portion of the barrier extending into an upper portion of the mast. The cap also includes a hood that retains a pass-through section of the chain allowing multiple stanchions to be linked together with a continuous length of barrier line. The base includes one or more pockets for receiving ballast blocks and the mast includes holes for receiving a sign or a sign holder plate to which a sign may be attached.

20 Claims, 16 Drawing Sheets

(56) References Cited

U.S. PATENT DOCUMENTS

| | | | |
|---|---|---|---|
| 10,458,133 B2 | 10/2019 | Davis | |
| 10,619,790 B2 | 4/2020 | Cuttill et al. | |
| 10,969,415 B2 | 1/2021 | Schipani | |
| 11,105,056 B1 | 8/2021 | Christopherson | |
| 11,708,918 B1 * | 7/2023 | Bell .......................... | F16L 3/10 248/68.1 |
| 2005/0008433 A1 | 1/2005 | Dvoracek | |
| 2018/0142834 A1 | 5/2018 | Cuttill et al. | |
| 2020/0240096 A1 | 6/2020 | Price et al. | |

FOREIGN PATENT DOCUMENTS

| | | |
|---|---|---|
| DE | 8335145 U1 | 4/1984 |
| DE | 202008001804 U1 | 10/2023 |
| FR | 2997970 A1 | 5/2014 |
| FR | 2997971 A1 | 4/2015 |
| JP | H03125708 A | 5/1991 |

OTHER PUBLICATIONS

Berry, Traffic Safety Barrier Post—Red | Stackable Delineator Post with PVC Weighted Base | 47.24" Traffic Delineator with Attachable Threaded Socket for Parking Barrier, Road Safety, Nov. 10, 2023, amazon.

* cited by examiner

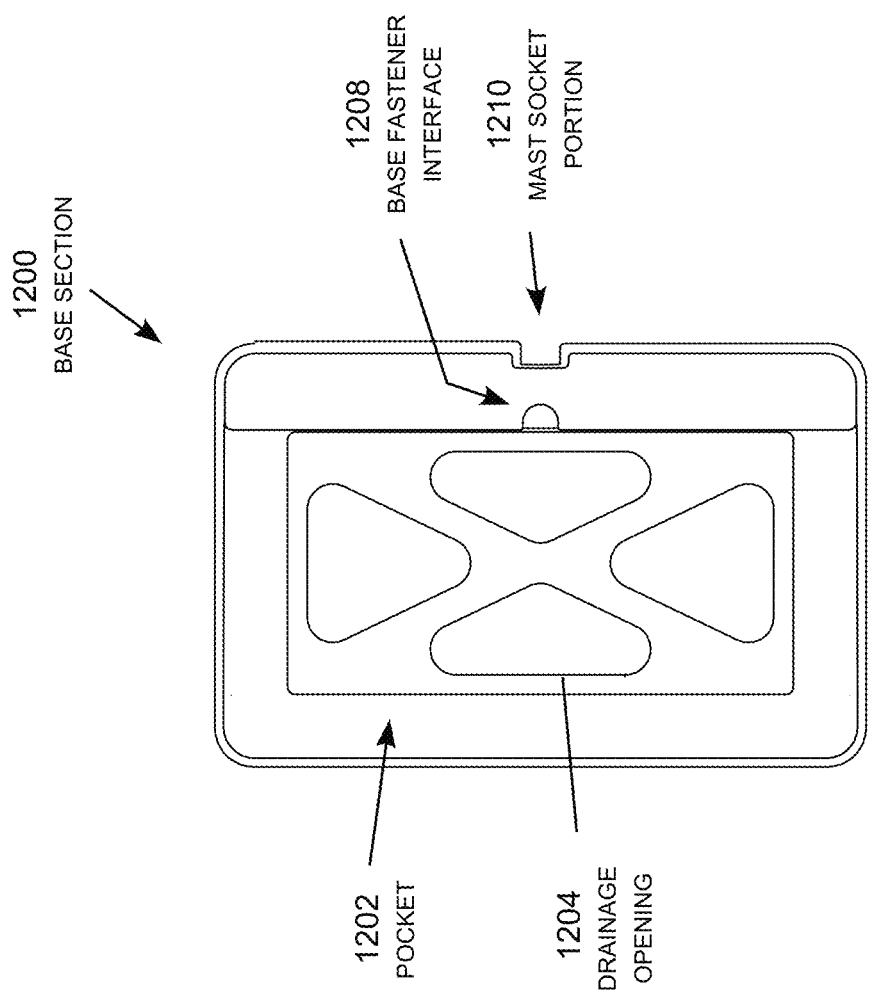

1300 TWO-SECTION ONE-MAST BASE

LOW-PIM BARRIER STANCHION AND SAFETY BARRIER

REFERENCE TO RELATED APPLICATIONS

This application claims priority to U.S. Provisional Patent Application Ser. No. 63/654,504 filed May 31, 2024, and U.S. Design patent application Ser. Nos. 29/952,910 and 29/952,968 filed Jul. 18, 2024, which are incorporated by reference.

TECHNICAL FIELD

The present invention is directed to cellular communication systems and, more particularly, to a low-PIM barrier stanchion, and a safety barrier including multiple low-PIM barrier stanchions with a low-PIM barrier line extending between the stanchions, for use near cellular base station antennas designed to warn workers of the risk of high RF radiation near the antenna while avoiding generation of passive intermodulation interference.

BACKGROUND

An essential element of modern mobile communications systems is the "cell site." The cell site includes one or more directional cellular base station antennas, mounted in an elevated location, aimed at a desired geographical coverage area. The height of antennas above ground level directly impacts the coverage distance that can be achieved by that cell site. For macro cell sites, designed to cover large geographic areas, the antennas are typically deployed at least 30 meters above ground level. Base station antennas are often located on building rooftops where that option is available.

Passive intermodulation known as "PIM" is a well-known type of electromagnetic interference in cellular systems. Downlink signals at cellular base stations mix at passive, non-linear junctions in the radio frequency (RF) path, creating new signals. PIM interference occurs when high-power downlink signals transmitted by the base station antennas mix creating new signals. If these new signals referred to as "intermodulation products" fall in an operator's uplink band, they act as interference and reduce signal to interference plus noise ratio (SINR). As the SINR is reduced, the geographic coverage of the cell site is reduced and the data capacity of that cell site is reduced. While "internal" PIM sources of the antenna itself are relatively easy to suppress, PIM sources located beyond the antenna, referred to as "external" PIM sources, are significantly more difficult to locate and suppress.

On rooftop cell sites, the antennas can be attached to metal frames deployed on the roof surface or attached to metal frames secured to building structures such as elevator housings or air handling equipment screens. In many cases, the antennas are recessed away from the building edge due to the availability of existing mounting structures or aesthetic requirements of the jurisdiction or building owner. This can result in areas on the rooftop in front of the antennas being exposed to high levels of RF radiation from the cell site antennas. It is the responsibility of mobile operators deploying rooftop cell sites to identify and control access to these RF radiation exposure areas to inform people working or passing in front of site antennas of the potential risk. With knowledge of the risk, workers can exercise control over their exposure by limiting time in the marked area or by other appropriate means.

Safety barriers with appropriate signage to warn workers of the RF radiation exposure risk are often deployed on rooftop cell sites. Highly visible signage may be attached to barriers. These warning signs typically include a hazard symbol, a signal word such as "Caution" or "Warning" and language to identify the hazard and the potential consequence of encountering the hazard. Conventional fencing for fall protection with warning signs attached have been used as RF warning barriers. While these barriers meet the mechanical robustness requirement of a typical rooftop environment, they may also include metal components and loose-fitting hardware known to generate significant levels of PIM. These barrier systems can also be expensive to deploy.

Another safety barrier option utilizes inexpensive plastic stanchions and plastic safety chains as shown in FIG. 1. While this type of plastic barrier avoids PIM creation, they are not designed to withstand the high wind, rain, snow, ice, solar heating, and UV exposure typically experienced in rooftop environments. As a result, they often tip over and get blown around in high wind conditions when used in rooftop cellular base station antenna locations.

A need therefore exists for an improved, inexpensive, low-PIM barrier solution for use in rooftop and other cellular base station antenna locations.

SUMMARY

The needs described above are met by a low-PIM barrier stanchion and associated safety barrier including multiple low-PIM barrier stanchions connected by a low-PIM barrier line. The low-PIM barrier stanchion includes a polymeric mast with an upper portion including a cap receiver and lower portion including a base receiver. A polymeric cap removably engaged with the cap receiver includes a receptacle for removably receiving an end portion of a low-PIM barrier line extending through the receptacle and into the upper portion of the mast. The polymeric cap also includes a hood extending above the receptacle defining a pass-through opening for passing the low-PIM barrier line and preventing the low-PIM barrier line from falling out of the cap when passed through the hood. A polymeric base removably engaged with the base receiver removably receives one or more ballast blocks.

In a representative embodiment, the barrier line is a low-PIM chain and the cap includes a receptacle including a cross-shaped opening corresponding to the shape of a low-PIM chain. The cap also includes a hood extending above the receptacle defining a chain pass-through opening for passing the low-PIM chain and preventing the low-PIM chain from falling out of the cap once passed through the hood. In addition, the cap may include a cuff for engaging the upper portion of the mast and a cap fastener for engaging the cap receiver of the mast when the cap is engaged with the upper portion of the mast. The cap fastener may also include a snap-fit connector that includes a beveled portion, a detent portion, and one or more channels for articulation of the snap-fit connector.

In a representative embodiment, the mast may also include a sign receiver, such as one or more holes through the mast, for receiving a sign removably attached to the one or more holes through the mast. Alternatively or additionally, the sign receiver may include a sign holder plate removably attached to the one or more holes through the mast, and a sign removably attached to the sign holder plate. The base may include a bottom side including one or more drainage openings. As another option, the base may include first and second base sections, each base section including a mast socket portion. In this case, one or more base fasteners extend through the mast and the mast socket portion of each base section to removably hold the base sections and the mast together.

It will be understood that specific embodiments may include a variety of features and options in different combinations, as may be desired by different users. Practicing the invention does not require utilization of all, or any particular combination, of these specific features or options. The specific techniques and systems for implementing particular embodiments of the invention and accomplishing the associated advantages will become apparent from the following detailed description of the embodiments and the appended drawings and claims.

BRIEF DESCRIPTION OF THE FIGURES

The numerous advantages of the embodiments of the invention may be better understood with reference to the accompanying figures.

FIG. 12 is a top view of a base section of the low-PIM barrier stanchion.

DETAILED DESCRIPTION OF REPRESENTATIVE EMBODIMENTS

Figure 1:
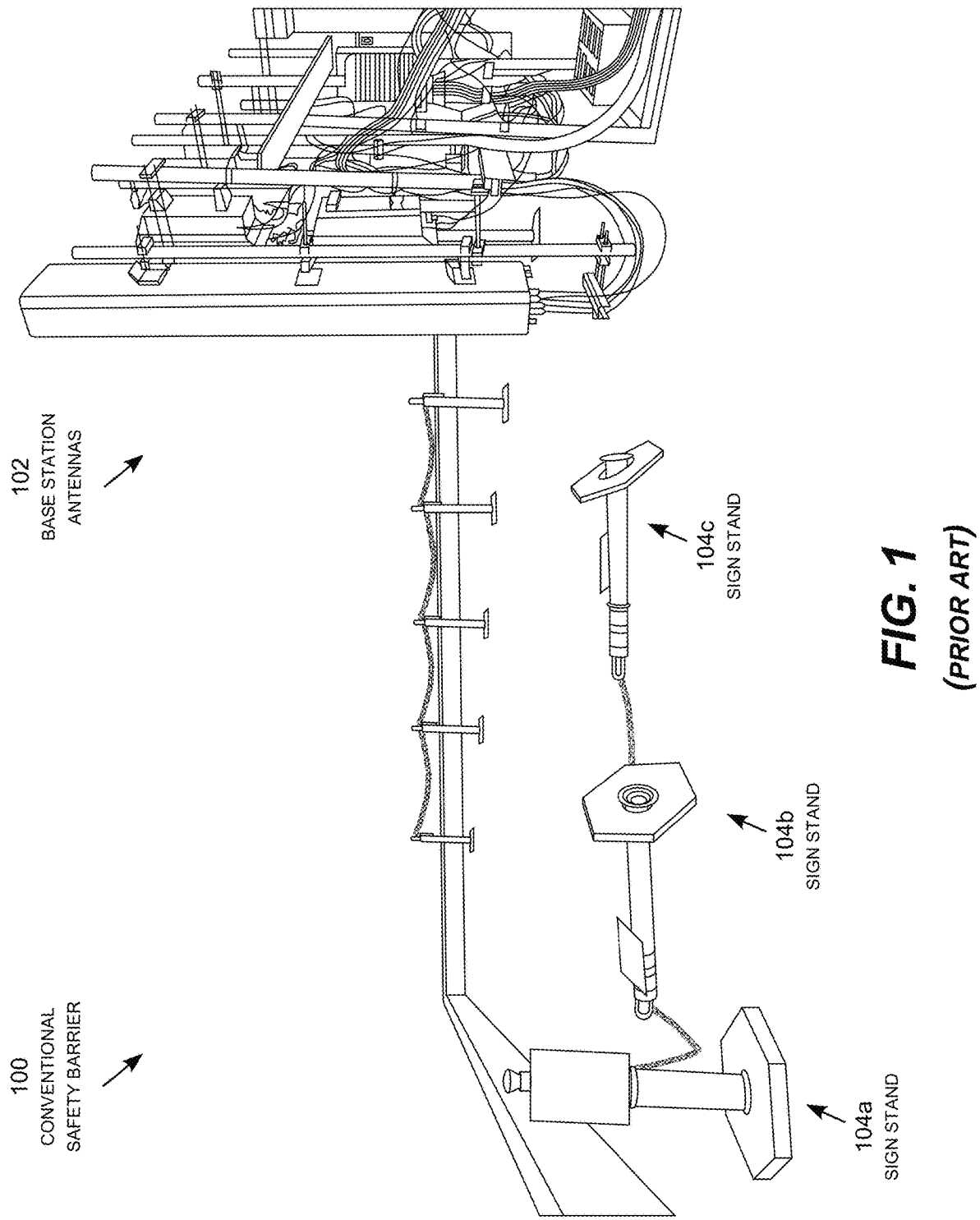
FIG. 1 (prior art) is a perspective illustration of a rooftop cellular base station antenna with a conventional plastic safety barrier.

Embodiments of the invention include a low-PIM barrier stanchion and a safety barrier including multiple low-PIM barrier stanchions connected by a low-PIM barrier line extending between the barrier stanchions. The barrier stanchion includes a cap that functions as a barrier line receiver, a mast that functions as a sign receiver, and a base that functions as a ballast receiver. The barrier line may be a non-metallic chain, rope, ribbon or other type of segmented or non-segmented cord.

The parts of the low-PIM barrier stanchion are easily assembled and disassembled for transportation and storage. The cap includes a barrier line receiver for retaining an end portion of a low-PIM barrier that extends into an upper portion of the mast. The cap also includes a hood that retains a pass-through section of the barrier line allowing multiple stanchions to be linked together with a continuous length of barrier line. The barrier line includes a knot, link shape, or other type of stop to engage the receptacle to prevent the barrier line from being easily pulled out of the stanchion laterally, while still allowing the barrier line to manually removed. For example, in an embodiment utilizing a chain as the barrier line, the cap includes a cross-shaped receptacle corresponding to the shape of the chain to prevent the chain from being easily pulled out of the stanchion laterally, while still allowing the chain to manually removed. The mast includes holes for receiving a sign or a sign holder plate to which a sign may be attached. Several alternative bases are disclosed including a two-piece base forming a single mast receptacle, a one-piece base with one ballast block pocket and a single mast receptacle, an alternative base with a two ballast block pockets and two mast receptacles, and another alternative base with two ballast block pockets and three mast receptacles. Other options and alternatives may be developed based on the reaching of the representative embodiments.

Turning to the figures, reference will now be made in detail to specific representative embodiments of the invention. In general, the same or similar reference numerals are used in the drawings and the description to refer to the same or like parts or steps. The drawings are in simplified form and are not to precise scale unless specifically indicated.

FIG. 1 (prior art) is a perspective illustration of a conventional safety barrier 100 in front of rooftop cellular base station antennas 102 utilizing conventional plastic sign stands represented by the enumerated sign stands 104a-104c. These sign stands may include loose-fitting metal hardware known to be significant source of PIM interference. They are also easily blown over in the winds experienced at many such rooftop installations.

Figure 2:
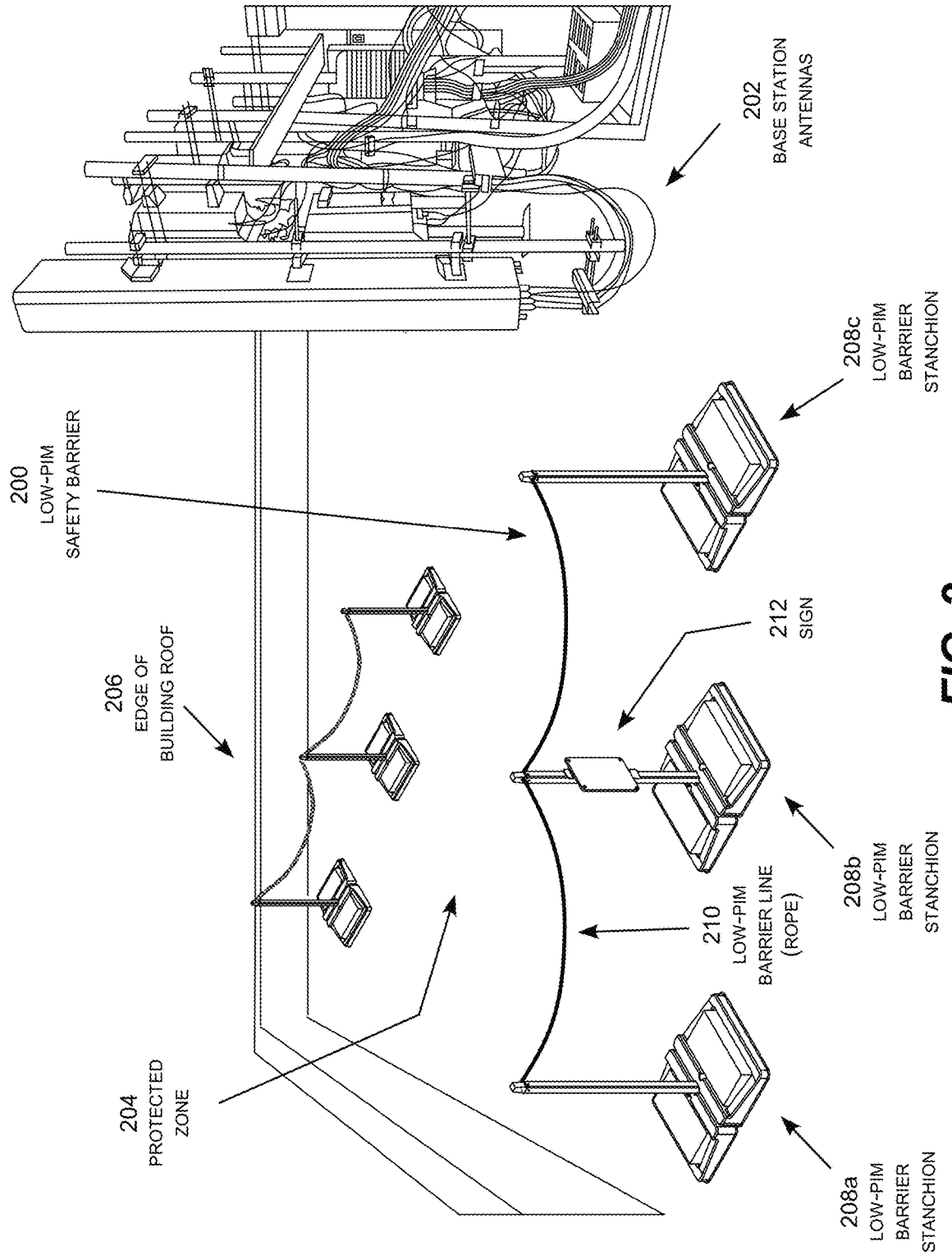
FIG. 2 is a perspective view of a low-PIM safety barrier in front of a rooftop cellular base station antenna.

FIG. 2 is a perspective illustration of a portion of a representative low-PIM safety barrier 200 positioned in front of the rooftop cellular base station antennas 202. In this example, the low-PIM safety barrier 200 is installed at the edge of a protected zone 204 in front of the base station antennas 202 near the edge 206 of the building. The representative portion of the low-PIM safety barrier 200 includes three low-PIM barrier stanchions 208a-208c. In this example, the low-PIM barrier line 210 is a non-metallic rope that passes through the cap of the center stanchion 208b with opposing end portions extending into the masts of respective end barrier stanchions 208a and 208c. The cap includes a receptacle to prevent the rope from being pulled out of the cap laterally, such as a hook, a round hole or a slot shaped hole to retain a loop or knot in the rope. In this example, the mast of the center barrier stanchion 208b supports a warning sign 212, for example displaying a hazard symbol and warning language, such as "Caution" or "Warning" indicating the risk of high RF radiation exposure in front of the base station antenna 202.

Figure 3:
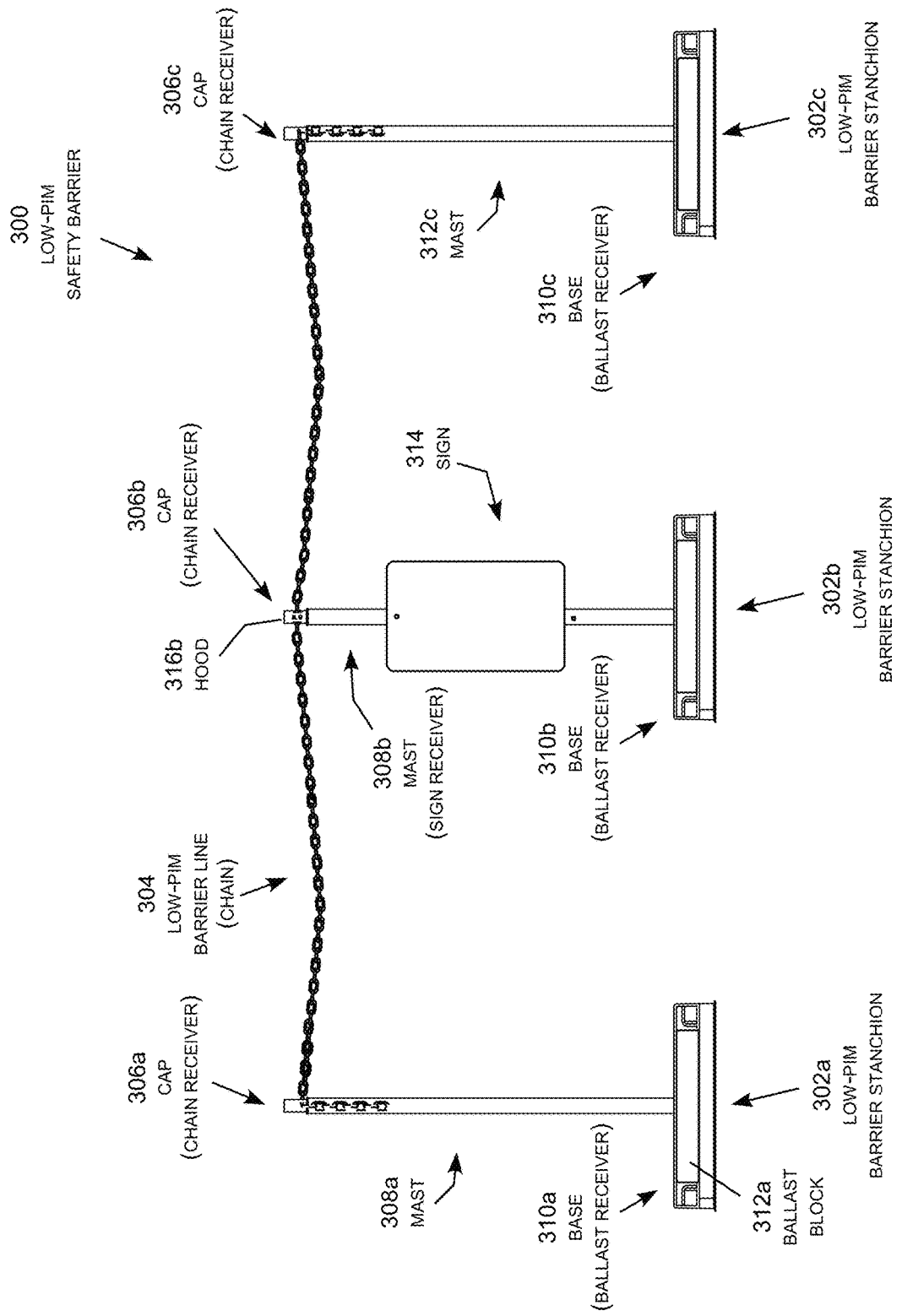
FIG. 3 is side view of a portion of a representative low-PIM safety barrier including three low-PIM barrier stanchions connected by a low-PIM barrier line.

FIG. 3 is side view of a portion of a representative low-PIM safety barrier 300, which includes three low-PIM barrier stanchions 302a-302c with a low-PIM barrier line 304, in this example a plastic chain, extending between the stanchions. The left barrier stanchion 302a is enumerated to point out the cap 306a, which functions as a barrier line receiver (chain receiver) for the low-PIM barrier line (chain) 304. The mast 308a is secured to the base 310a, which functions as a ballast receiver for the ballast block 312a. The mast 308b of the center stanchion 302b functions a sign receiver for the sign 314. Alternatively, the mast may support a sign holder plate (see FIG. 14) to which the sign is attached. An end portion of the barrier line 304 passes through a barrier line receptacle (see FIG. 4) of the cap 306a of the left stanchion 302a. Similarly, an opposing end portion of the barrier line 304 passes through a barrier line receptacle of the cap 306c of the right stanchion 302c. The barrier line 304 also passes through the hood 316b of the cap 306b of the center stanchion 302b. The hood 316b keeps the barrier line from falling out of the cap 306b once passed through the hood. Each base 310a-310c includes two base sections (see FIGS. 5-6) that each hold a ballast block represented by the enumerated ballast block 312a of the left stanchion 302a.

Figure 4:
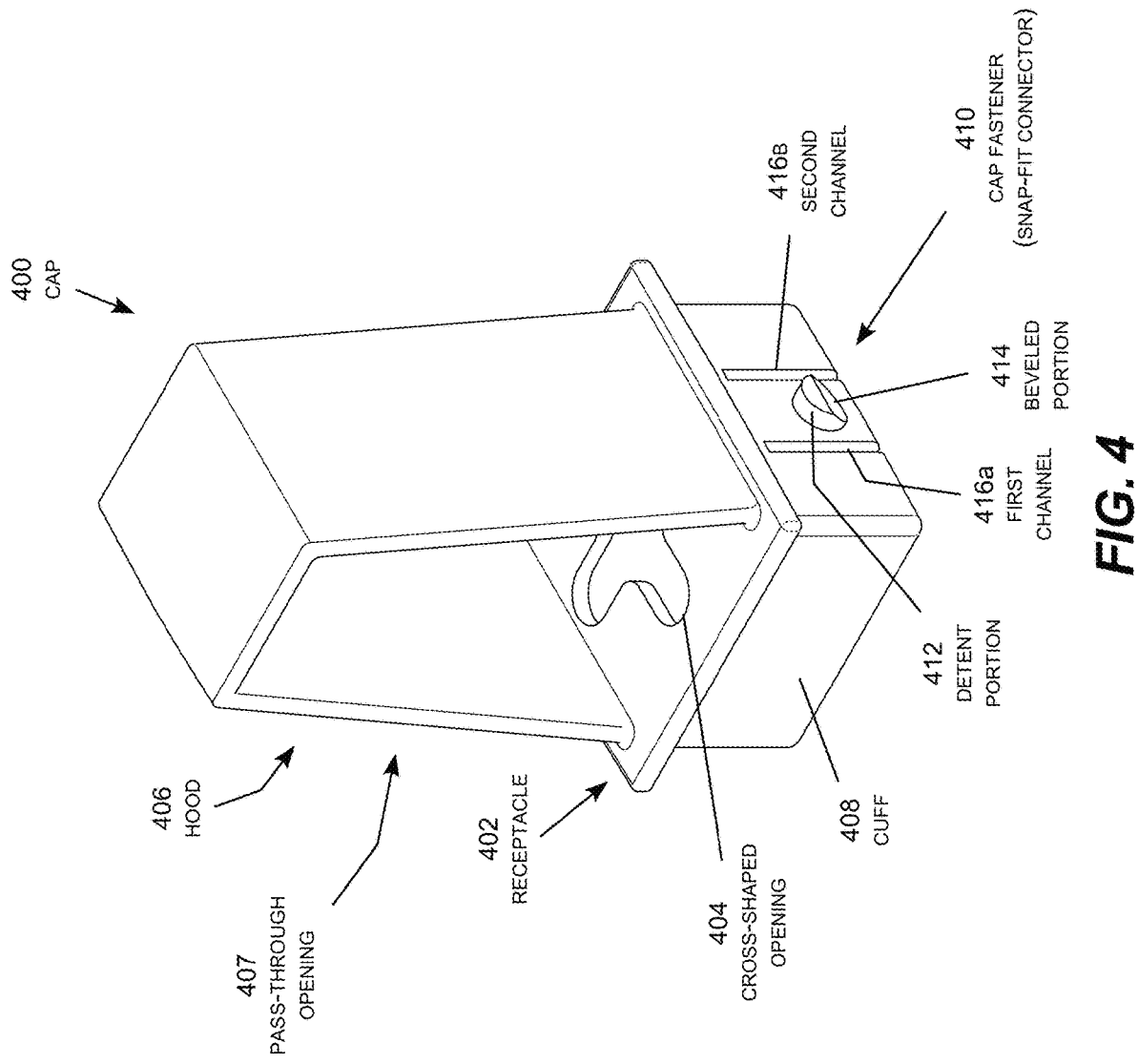
FIG. 4 is a perspective view of the cap of a representative example low-PIM barrier stanchion.

FIG. 4 is a perspective view of an example cap 400 of the representative low-PIM barrier stanchion. The example cap 400 includes a receptacle 402 with a cross-shaped opening 404 corresponding to the shape of the low-PIM barrier line, in this example a plastic chain the cap is designed to receive. In this example, each aligned pair of lobes of the cross-shaped opening is slightly larger than a link of the chain preventing the chain from being easily pulled laterally out of the receptacle plate 402, while also allowing the chain to be manually removed in a vertical direction. The hood 406 is therefore tall enough to accommodate at least a link and a half of the low-PIM chain to facilitate insertion and removal of the chain under the hood and through the receptacle 402. The hood 406 extending above the receptacle 402 also provide a pass-through opening 407 for the barrier line that keeps the pass-through section of the chain form falling out of the cap.

The cap 400 also includes a cuff 408 shaped to be received in the upper portion of the low-PIM mast. Alternatively, the cuff 408 shaped to be received over the upper portion of the low-PIM mast. In this example, the cuff 408 includes a cap fastener, specifically a snap-fit connector 410 including a detent portion 412 and a beveled portion 414. A pair of open channels 416a and 416b through the cuff wall in either side of the snap-fit connector facilitate reception and release of the snap-fit connector 410 in a hole in the upper portion of the mast (see FIG. 5). The cap 400 may include multiple snap-fit connectors 410 on multiple sides of the cuff, such as a pair of snap-fit connectors on opposing sides of the cuff.

Figure 5:
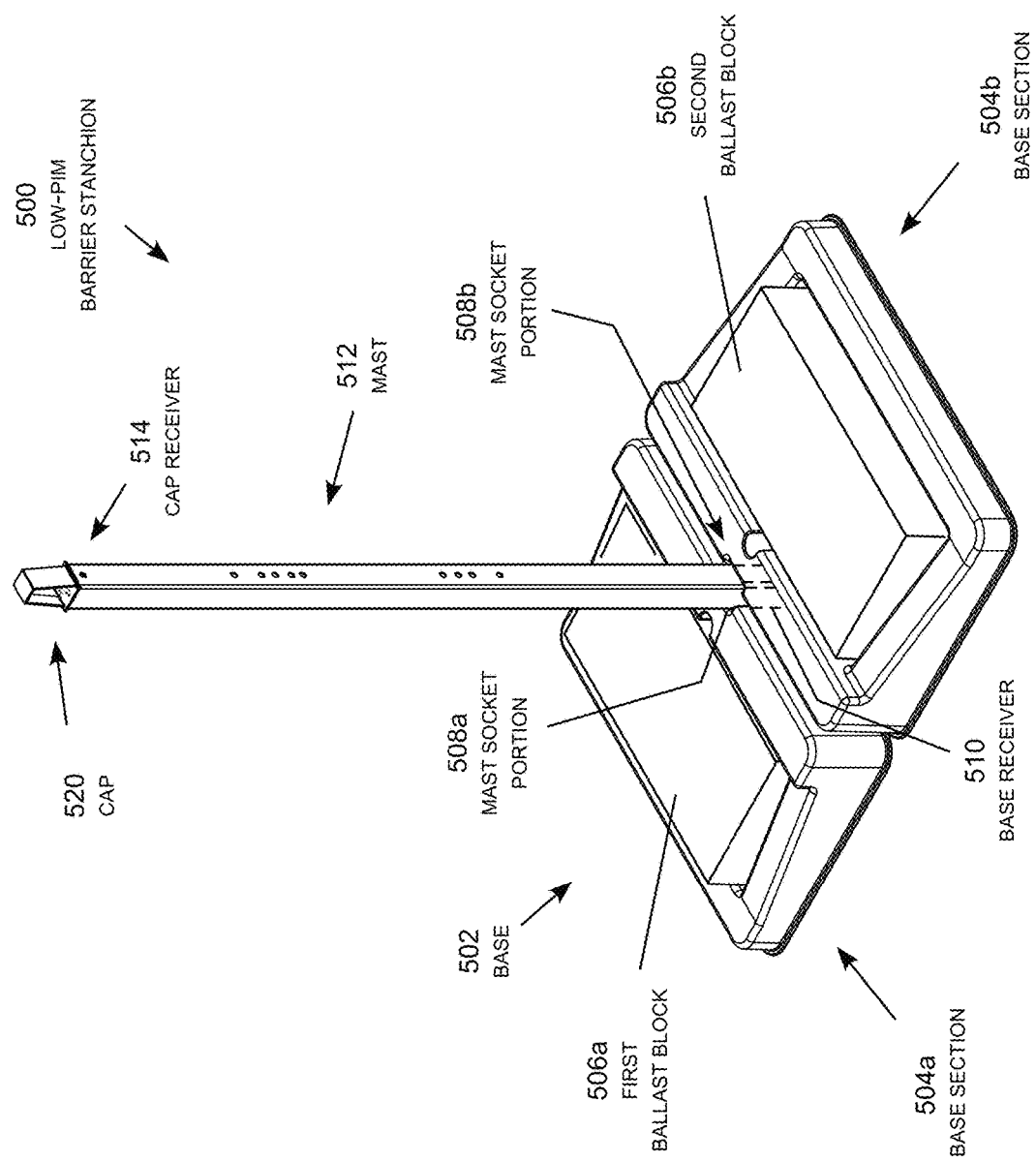
FIG. 5 is a perspective view of the low-PIM barrier stanchion with base ballast blocks.

FIG. 5 is a perspective view of a representative low-PIM barrier stanchion 500 that includes a base 502 formed by a pair of opposing base sections 504a and 504b, each holding a respective ballast block 506a, 506b. The base sections 504a and 504b may be interchangeable iterations of the same base section requiring only one type of base section mold, thus limiting the number of molds required for fabrication of the barrier stanchion. The opposing base sections 504a and 504b each include a respective mast socket portion 508a, 508b, which together form a mast socket for receiving a base receiver 510 on the lower portion of the mast 512. In this example, the mast socket formed by the base sections 504a and 504b and the base receiver 510 on the lower portion of the mast 512 included an aligned set of holes for receiving base fasteners (see FIGS. 7A-7B), such as bolts that removably hold the base sections and the mast together. While other types of base fasteners may be used, bolts are a suitable and inexpensive option. A cap 520 fits into a cap receiver 514 formed by the top of the mast 512. As an alternative, the cap 520 may fit over the cap receiver 514. In this example embodiment, the cap receiver 512 includes one or more holes that receive a cap fastener, such as the cap fastener 410 shown in FIG. 4. In addition, the mast 512 includes one or more holes that serve as a sign receiver. The sign may mount directly to the mast (see FIG. 8) or to a sign holder mounted to the mast (see FIG. 14).

Figure 6:
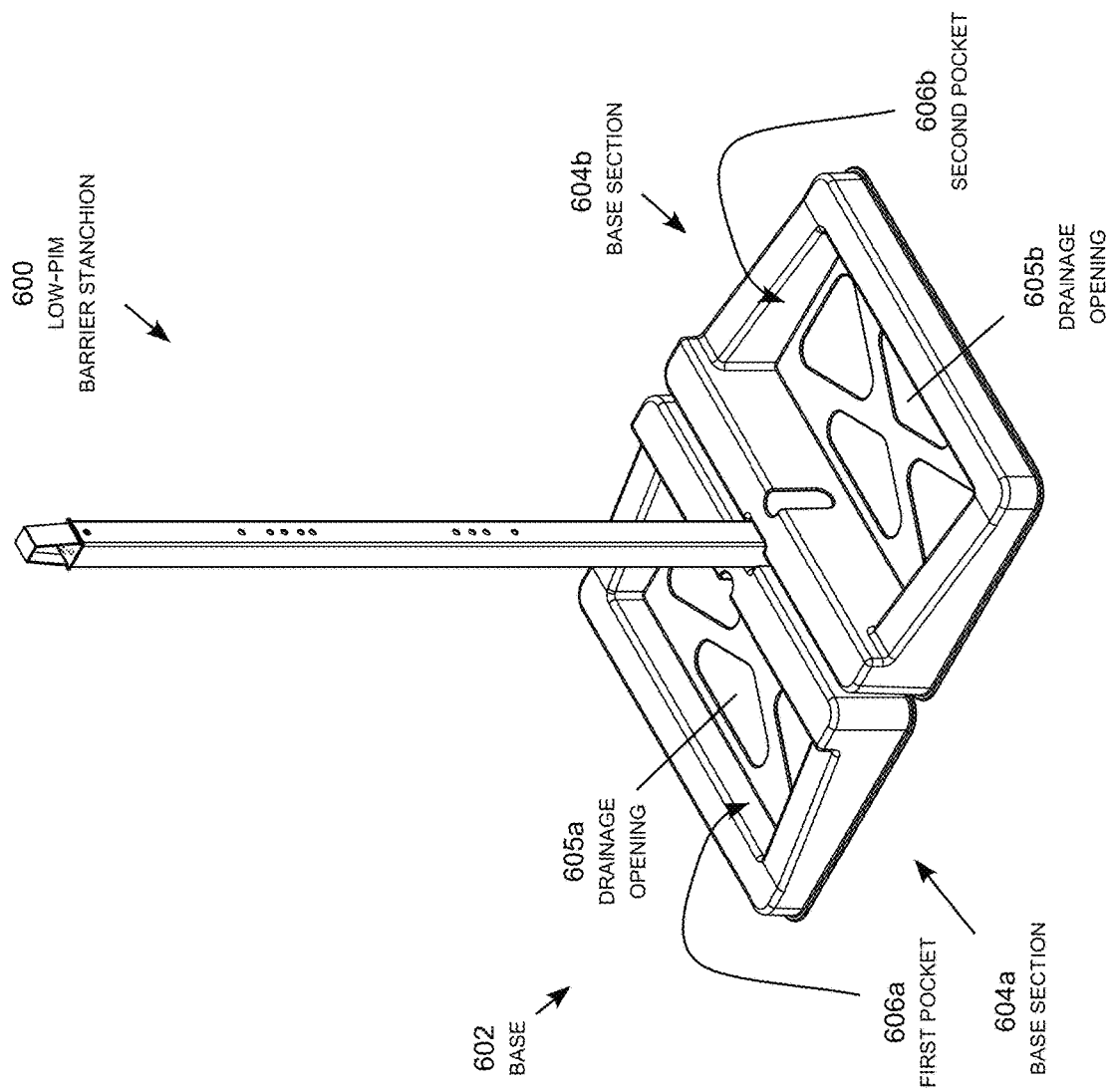
FIG. 6 is a perspective view of the low-PIM barrier stanchion without base ballast blocks.

FIG. 6 is a perspective view of the low-PIM barrier stanchion 600 without ballast blocks in the base 602. As shown in this example, each base section 604a and 604b defines a respective pocket 606a, 606b for receiving a ballast block, such as a standard construction block. Each base section 604a and 604b also includes respective drainage openings represented by the enumerated drainage openings 605a, 605b.

Figure 7:
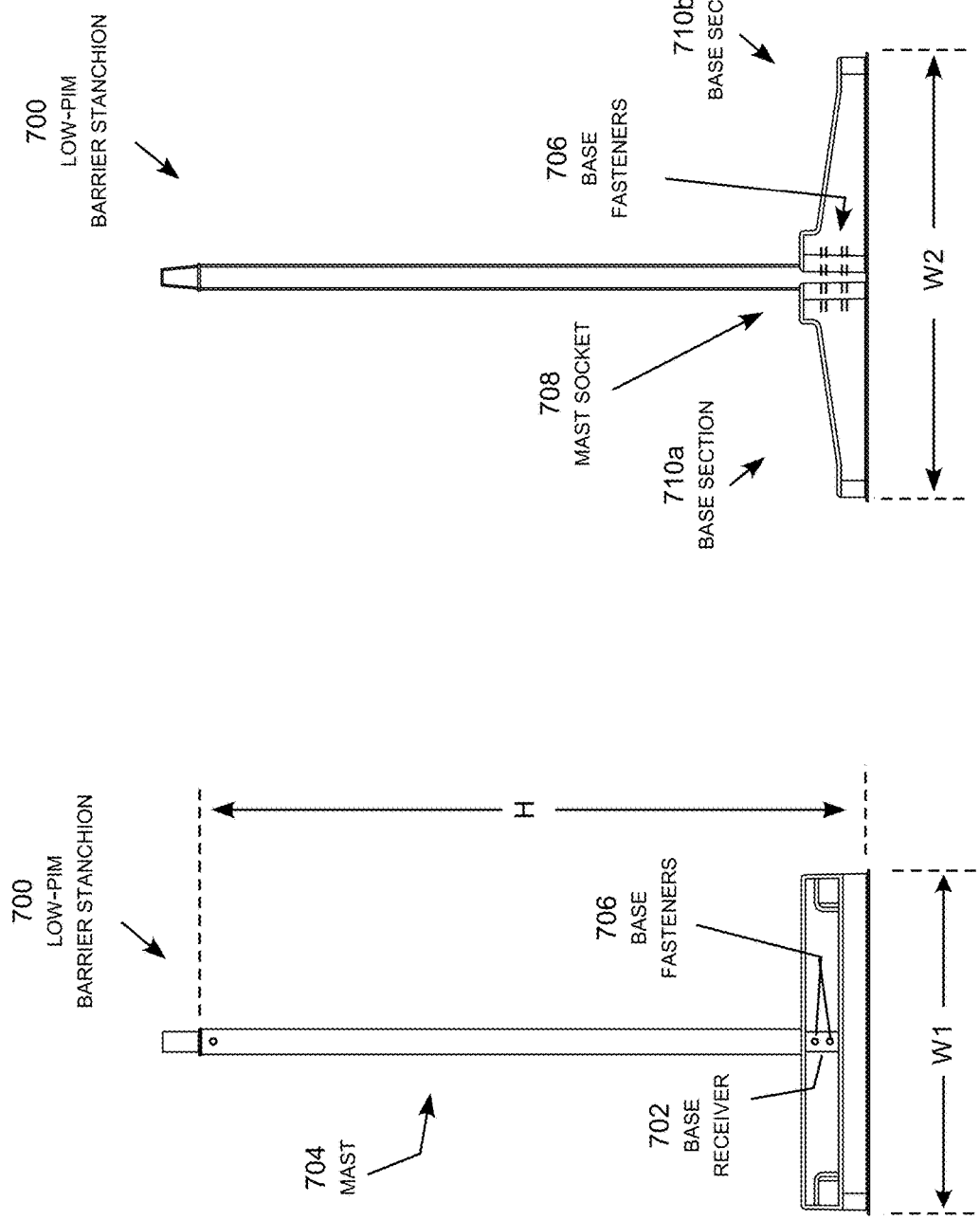
FIG. 7A is a side view of the low-PIM barrier stanchion.
FIG. 7B is an end view of the low-PIM barrier stanchion.

FIG. 7A is a side view and FIG. 7B is an end view of a representative example low-PIM barrier stanchion 700. This example is shown substantially to scale with a mast height "H" of approximately 48 inches (122 cm), a base section width W1 of 21 inches (53 cm), and a two-part base width W2 of 27 inches (69 cm). This example also illustrates the base receiver 702 on the lower portion of the mast 704 and the base fasteners 706, which extend through aligned holes of the base receiver 702 and the mast socket 708 formed by the opposing base sections 710a and 710b.

Figure 8:
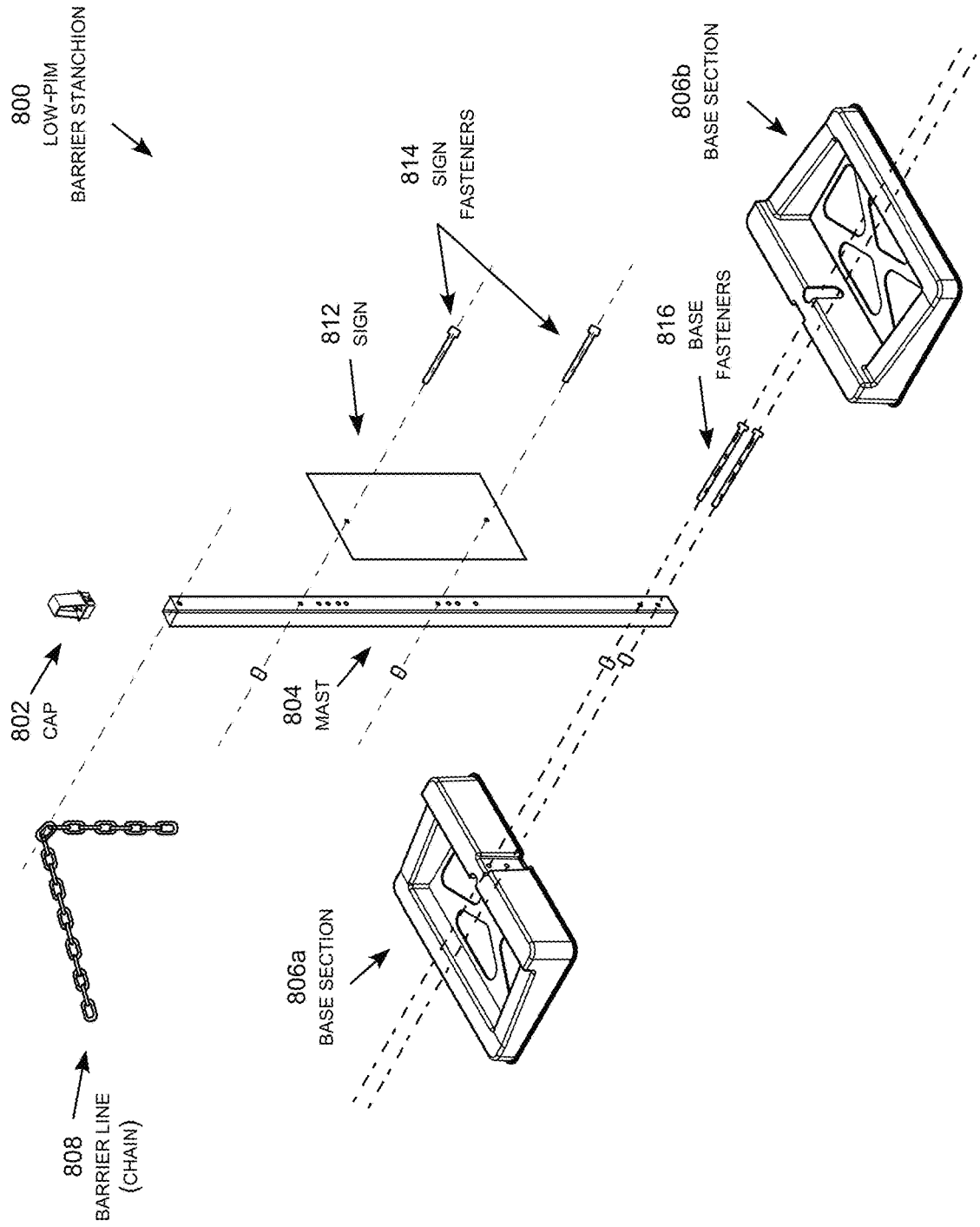
FIG. 8 is an exploded perspective view of the low-PIM barrier stanchion.

FIG. 8 is an exploded perspective view of a representative low-PIM barrier stanchion 800. This example includes a cap 802, mast 804 and base including first and second base sections 806a and 806b. The cap 802 and upper portion of the mast 804 is sized to removably receive the low-PIM barrier line 808, in this example a plastic chain. A sign 812 is removably attached to the mast by sign fasteners 814. The base sections 806a and 806b are removably attached to each other and the lower portion of the mast 804 by base fasteners 816.

Figures 9A, 9B:
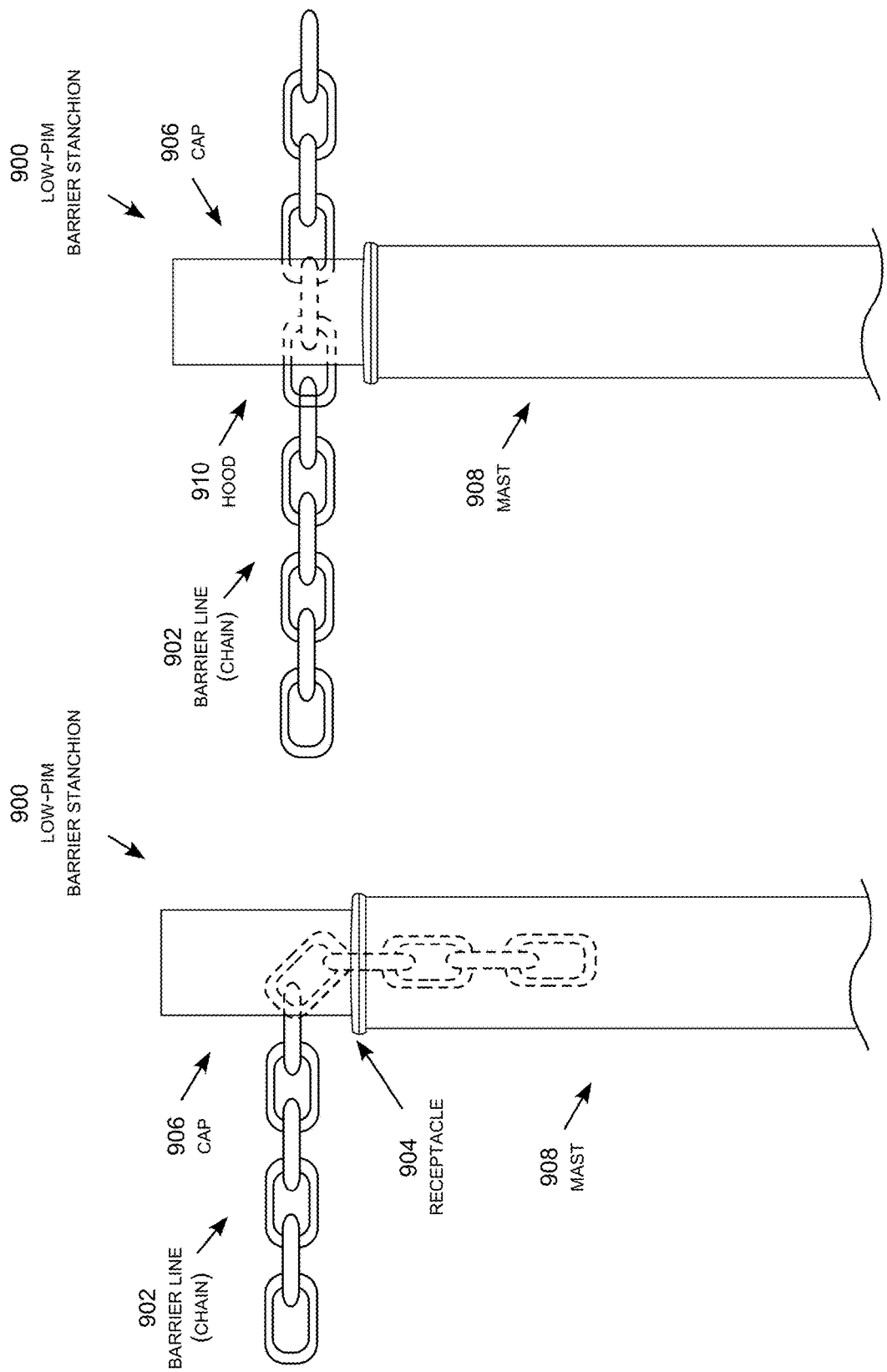
FIG. 9A is a side view of the upper portion of the low-PIM barrier stanchion with an end portion of the barrier line extending into the upper portion of the mast.
FIG. 9B is a side view of the upper portion of the low-PIM barrier stanchion with the barrier line extending through the cap.

FIG. 9A is a side view of the upper portion of the low-PIM barrier stanchion 900 in which the barrier line is a plastic chain 902. In this embodiment, an end portion of the chain 902 extends through the receptacle 904 of the cap 906 into the upper portion of the mast 908. This configuration corresponds to the left and right barrier stanchions 308a and 308c shown in FIG. 3 with the plastic chain 902 serving as the barrier line. FIG. 9B is a side view of the upper portion of the low-PIM barrier stanchion 900 with a pass-through portion of the chain 902 extending through the hood 910 of the cap 906, which prevents the chain from falling out of the cap once passed through the hood. This configuration corresponds to the center barrier stanchion 308b shown in FIG. 3.

Figure 11:
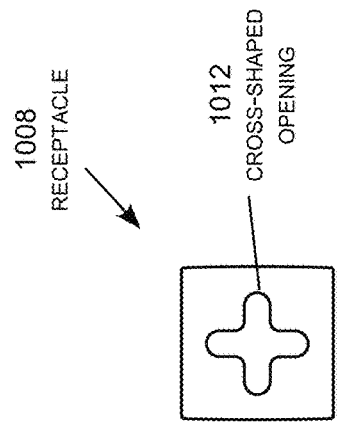
FIG. 11 is a top view showing a cross-shaped receptacle of a low-PIM barrier stanchion cap.
Figure 10:
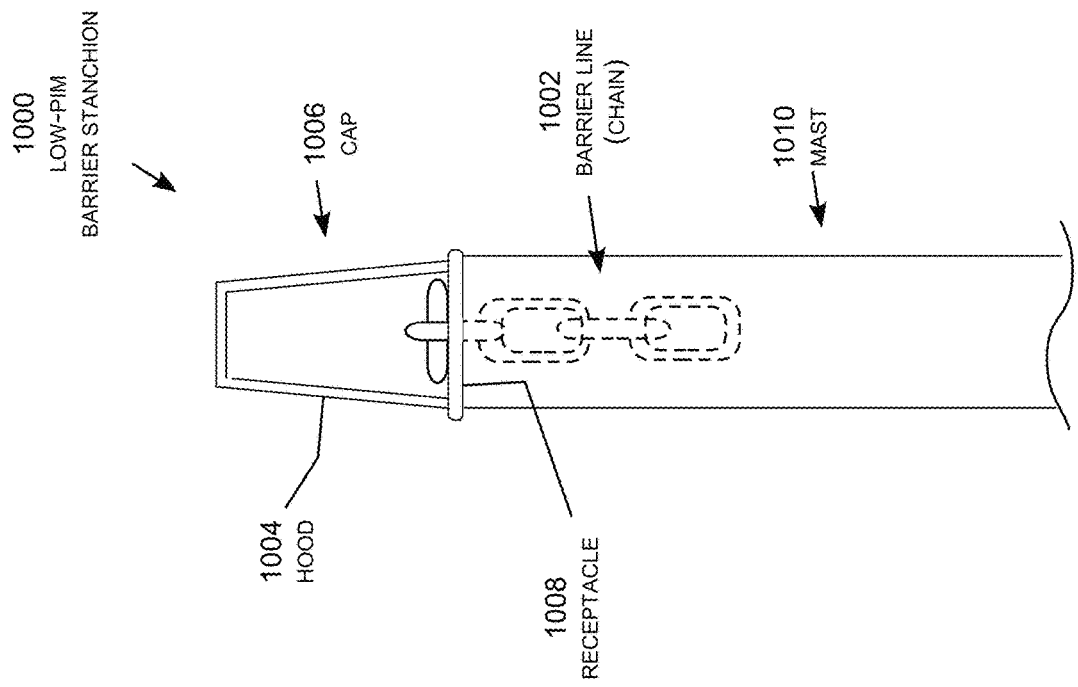
FIG. 10 is an end view of the upper portion of the low-PIM barrier stanchion with an end portion of the barrier line extending into an upper portion of the mast.

FIG. 10 is an end view of the upper portion of a representative low-PIM barrier stanchion 1000 with a plastic chain 1002 serving as the barrier line. This example shows the chain 1002 extending into the hood 1004 of the cap 1006, through the receptacle 1008, and into the upper portion of the mast 1010. FIG. 11 shows a top view showing the cross-shaped opening 1012 of the receptacle 1008, which has a shape corresponding to the shape of the chain 1002. In this example, each aligned pair of lobes of the cross-shaped opening 1012 is slightly larger than a link of the chain 1002 preventing the chain from being easily pulled laterally out of the receptacle.

Figure 13:
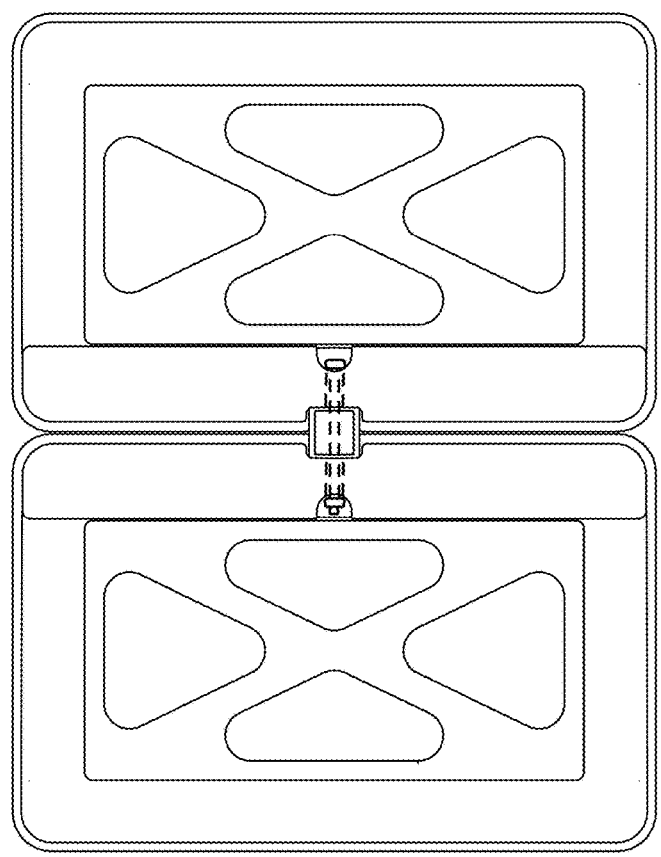
FIG. 13 is a top view of the low-PIM barrier stanchion with a two-part base.

FIG. 12 is a top view of a representative base section 1200 of the low-PIM barrier stanchion. This example includes a pocket 1202 for receiving a ballast block and one or more drainage opening represented by the enumerated drainage opening 1204. This example also forms a base fastener interface 1208 and a mast socket portion 1210. This example is thus configured to serve as one base section of a two-section base 1300 that supports a single mast as shown in FIG. 13, which is a top view of the two-section, one-mast base.

Figure 14:
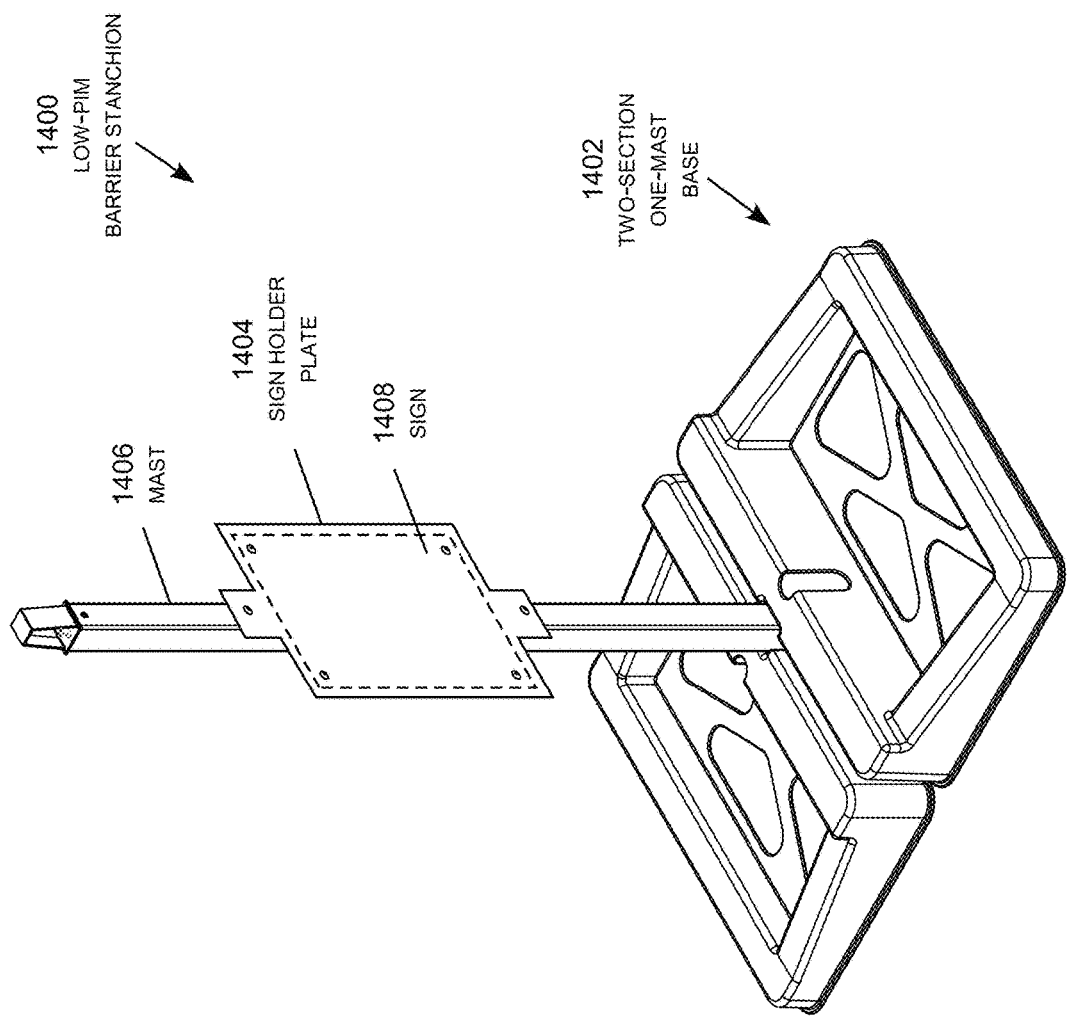
FIG. 14 is a perspective view of an alternative example of the low-PIM barrier stanchion with a sign holder plate.

FIG. 14 is a perspective view of a representative embodiment of the low-PIM barrier stanchion 1400 with a two-part base 1402 and a sign holder plate 1404 supporting a sign 1408. The mast 1406 may include a number of holes for receiving typically sized signs and sign holders.

Figure 15:
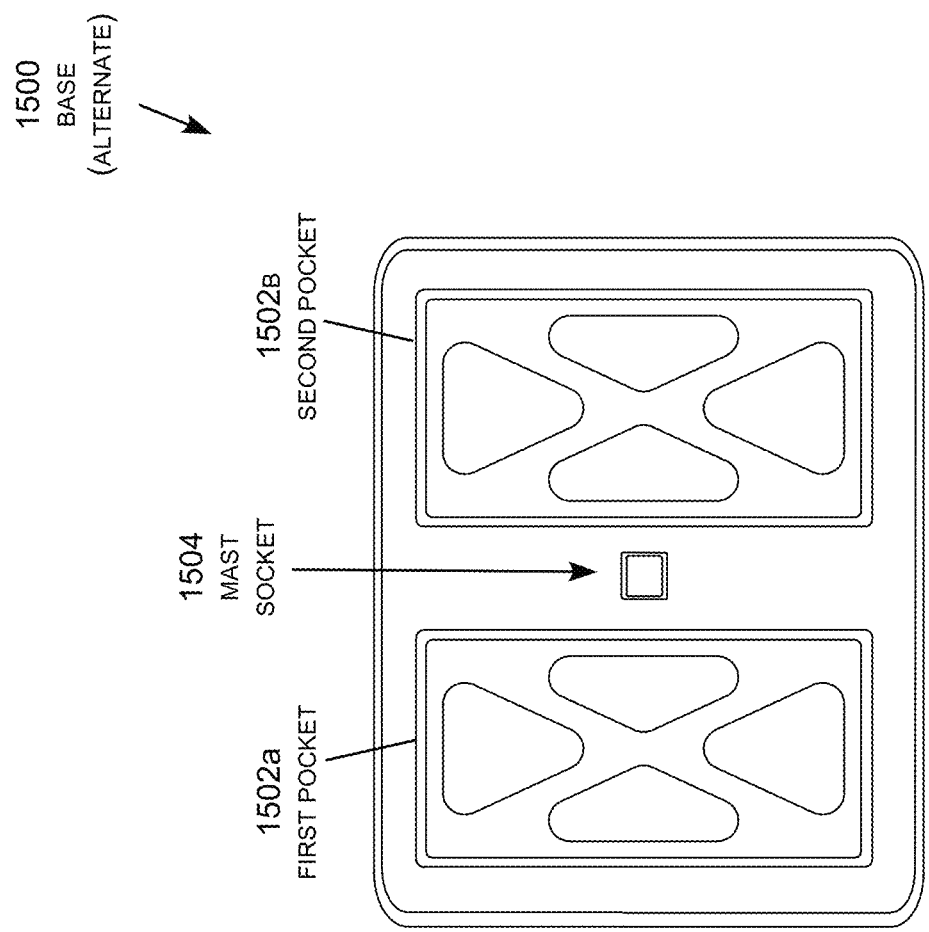
FIG. 15 is a top view of the representative example base of the low-PIM barrier stanchion with a one-part base and one mast receiver socket.

FIG. 15 is a top view of another representative example base 1500, in this example a one-part base that includes two ballast pockets 1502a, 1502b and one mast receiver socket 1504.

Figure 16:
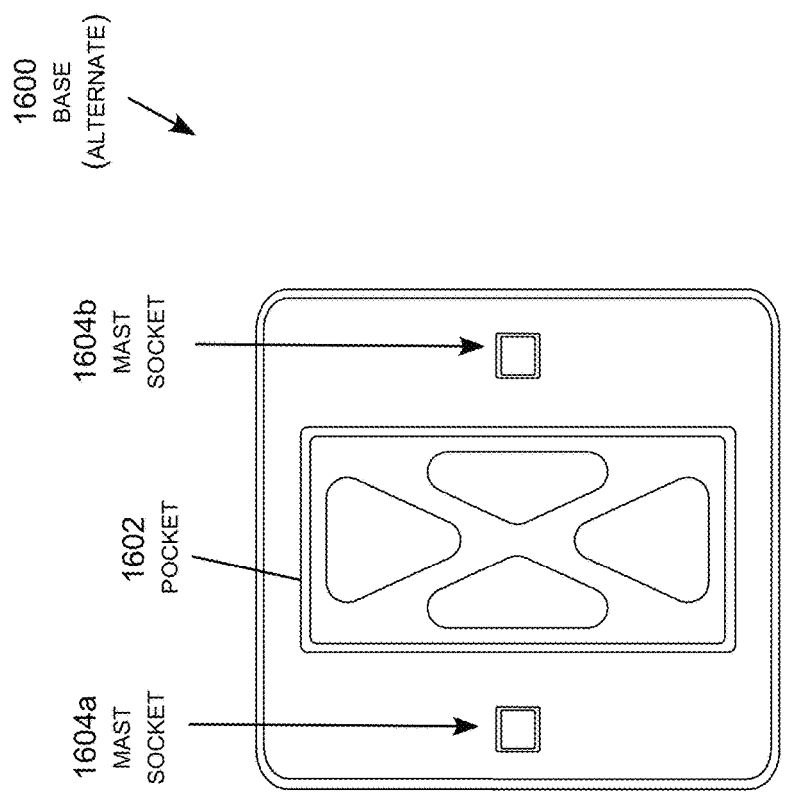
FIG. 16 is a top view of an alternate base section with one ballast block pocket and two mast receiver sockets.

FIG. 16 is a top view of another representative example base 1600 that includes one ballast pocket 1602 two mast receiver sockets 1604a, 1604b.

Figure 17:
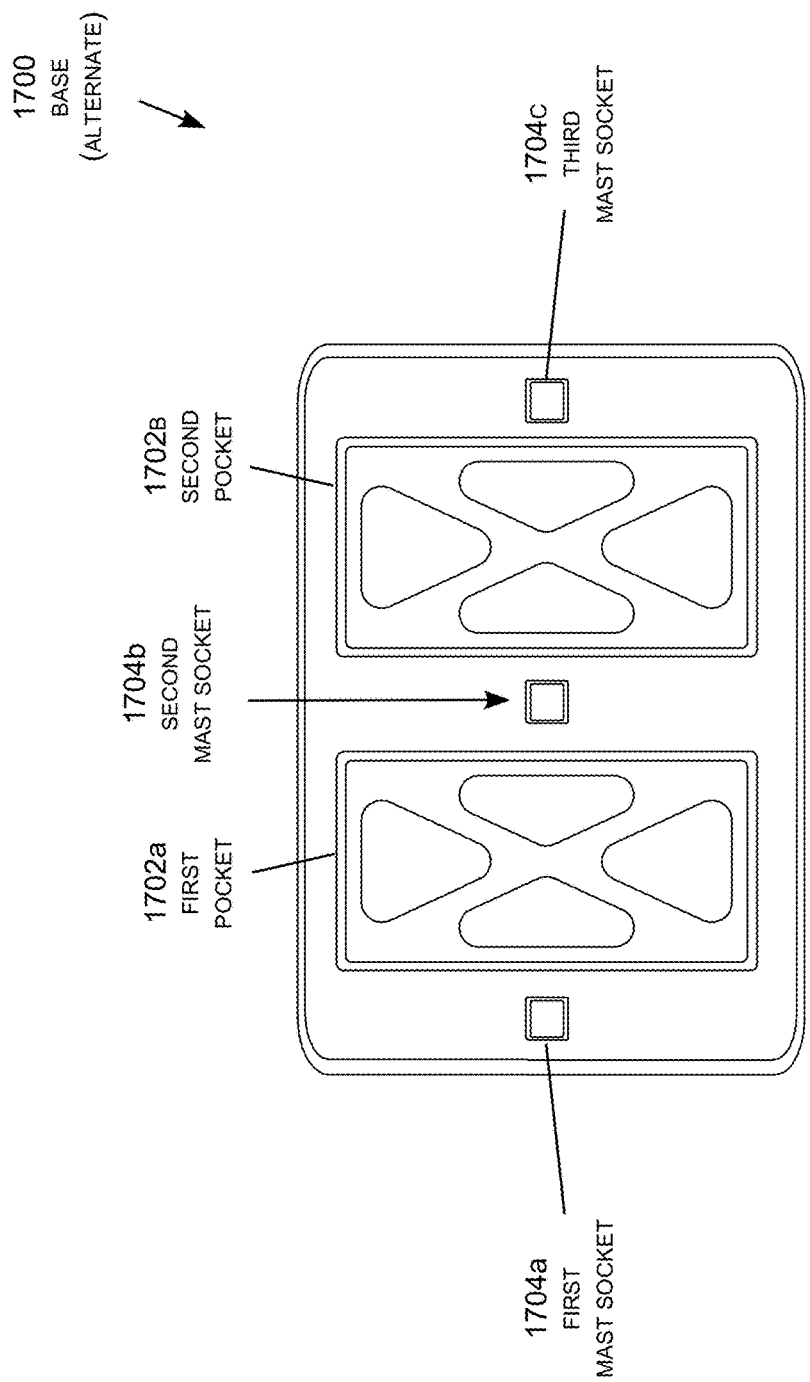
FIG. 17 is a top view of another alternate base section with two ballast block pockets and three mast receiver sockets.

FIG. 17 is a top view of another representative example base 1700 that includes two ballast pockets 1702a, 1702b and three mast receiver sockets 1704a-1704c.

Those skilled in the art will be enabled to fabricate other options and alternatives based on the representative alternatives and options. In general, the main components (base, mast and cap) of the low-PIM chain station may be fabricated from any suitable plastic. For example, the cap may be injection molded and fabricated from a plastic material suitable for injection molding, such as glass-filled nylon or polycarbonate. The mast may be fiberglass, and the base may be blow molded and fabricated from a plastic suitable for blow molding, such as high-density polypropylene (HDPE). The fastener hardware may be galvanized steel or any other suitable fastener material.

The words "couple" and similar terms do not necessarily denote direct and immediate connections, but also include connections through intermediate elements or devices. Certain descriptors, such "first" and "second," "top and bottom," "upper" and "lower," "inner" and "outer," or similar relative terms may be employed to differentiate structures from each other. These descriptors are utilized as a matter of descriptive convenience and are not employed to implicitly limit the invention to any particular position or orientation. It will also be understood that specific embodiments may include a variety of features and options in different combinations, as may be desired by different users. Practicing the invention does not require utilization of all, or any particular combination, of these specific features or options.

This disclosure sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components may be combined to achieve a particular functionality can be seen as "associated with" each other such that the desired functionality is achieved, irrespective of architectures or intermediate components. Likewise, any two components so associated can also be viewed as being "connected" or "coupled" to each other to achieve the desired functionality, and any two components capable of being so associated can also be viewed as being "functionally connected" to each other to achieve the desired functionality. Specific examples of functional connection include but are not limited to physical connections and/or physically interacting components and/or wirelessly communicating and/or wirelessly interacting components and/or logically interacting and/or logically interacting components.

Although particular embodiments of this disclosure have been illustrated, it is apparent that various modifications and embodiments of the disclosure may be made by those skilled in the art without departing from the scope and spirit of the disclosure. It will therefore be appreciated that the present invention provides significant improvements. The foregoing relates only to the exemplary embodiments of the present invention, and that numerous changes may be made therein without departing from the spirit and scope of the invention as defined by the following claims.

The invention claimed is:

1. A low-PIM barrier stanchion, comprising:
a polymeric mast comprising an upper portion comprising a cap receiver and lower portion comprising a base receiver;
a polymeric cap removably engaged with the cap receiver comprising a receptacle for removably receiving an end portion of a low-PIM barrier line extending through the receptacle and into the upper portion of the mast;
the polymeric cap further comprising a hood extending above the receptacle defining a pass-through opening for passing the low-PIM barrier line and preventing the low-PIM barrier line from falling out of the cap when passed through the hood;
a polymeric base removably engaged with the base receiver for removably receiving a ballast block.

2. The low-PIM barrier stanchion of claim 1, wherein:
the low-PIM barrier line comprises a low-PIM chain;
the receptacle comprises a cross-shaped opening corresponding to a shape of the low-PIM chain.

3. The low-PIM barrier stanchion of claim 1, wherein the cap further comprises a snap-fit connector comprising a beveled portion, a detent portion, and one or more channels for articulation of the snap-fit connector.

4. The low-PIM barrier stanchion of claim 1, wherein the mast further comprises a cap retainer hole for receiving the cap fastener when the cuff is received in the upper portion of the mast.

5. The low-PIM barrier stanchion of claim 1, wherein the mast further comprises a sign receiver.

6. The low-PIM barrier stanchion of claim 5, wherein the sign receiver comprises one or more holes through the mast for receiving a sign removably attached to the one or more holes through the mast.

7. The low-PIM barrier stanchion of claim 5, wherein the sign receiver comprises a sign holder plate removably attached to the one or more holes through the mast, and a sign removably attached to the sign holder plate.

8. The low-PIM barrier stanchion of claim 1, wherein the base comprises a bottom side comprising one or more drainage openings.

9. The low-PIM s barrier stanchion of claim 1, wherein the base comprises first and second base sections, wherein each base section comprises a mast socket portion.

10. The low-PIM barrier stanchion of claim 9, further comprising one or more base fasteners extending through the mast and the mast socket portion of each base section.

11. A low-PIM safety barrier, comprising a plurality of low-PIM barrier stanchions and a low-PIM barrier line extending between the low-PIM barrier stanchions, wherein each low-PIM barrier stanchion comprises:
- a polymeric cap removably engaged with the cap receiver comprising a receptacle for removably receiving an end portion of a low-PIM barrier line extending through the receptacle and into the upper portion of the mast;
- the polymeric cap further comprising a hood extending above the receptacle defining a pass-through opening for passing the low-PIM barrier line and preventing the low-PIM barrier line from falling out of the cap when passed through the hood;
- a polymeric base removably engaged with the base receiver for removably receiving a ballast block.

12. The low-PIM safety barrier of claim 10, wherein:
each low-PIM barrier line comprises a low-PIN chain;
each receptacle comprises a cross-shaped opening corresponding to a shape of the low-PIM chain.

13. The low-PIM safety barrier of claim 10, wherein each cap further comprises a snap-fit connector comprising a beveled portion, a detent portion, and one or more channels for articulation of the snap-fit connector.

14. The low-PIM safety barrier of claim 10, wherein each mast further comprises a cap retainer hole for receiving the cap fastener when the cuff is received in the upper portion of the mast.

15. The low-PIM safety barrier of claim 10, wherein each mast further comprises a sign receiver.

16. The low-PIM safety barrier of claim 15, wherein the sign of each mast receiver comprises one or more holes through the mast for receiving a sign removably attached to the one or more holes through the mast.

17. The low-PIM safety barrier of claim 15, wherein the sign receiver of each mast comprises a sign holder plate removably attached to the one or more holes through the mast, and a sign removably attached to the sign holder plate.

18. The low-PIM safety barrier of claim 10, wherein the base of each low-PIM barrier stanchion comprises a bottom side comprising one or more drainage openings.

19. The low-PIM safety barrier of claim 10, wherein the base comprises first and second base sections, wherein each base section comprises a mast socket portion.

20. The low-PIM safety barrier of claim 19, wherein each low-PIM barrier stanchion further comprises one or more base fasteners extending through the mast and the mast socket portion of each base section.

* * * * *